US007113605B2

(12) United States Patent
Rui et al.

(10) Patent No.: US 7,113,605 B2
(45) Date of Patent: Sep. 26, 2006

(54) SYSTEM AND PROCESS FOR TIME DELAY ESTIMATION IN THE PRESENCE OF CORRELATED NOISE AND REVERBERATION

(75) Inventors: Yong Rui, Sammamish, WA (US); Dinei Florencio, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 11/182,633

(22) Filed: Jul. 14, 2005

(65) Prior Publication Data

US 2005/0249038 A1 Nov. 10, 2005

Related U.S. Application Data

(63) Continuation of application No. 10/404,219, filed on Mar. 31, 2003, now Pat. No. 7,039,200.

(51) Int. Cl.
*H04R 3/00* (2006.01)
*H04B 15/00* (2006.01)
*H03B 29/00* (2006.01)

(52) U.S. Cl. ........................ 381/92; 381/94.1; 381/71.2

(58) Field of Classification Search ..................... None
See application file for complete search history.

(56) References Cited

U.S. PATENT DOCUMENTS 5,602,962 A * 2/1997 Kellermann ................ 704/226
5,610,991 A * 3/1997 Janse .......................... 381/92
5,835,607 A * 11/1998 Martin et al. .............. 381/94.1

OTHER PUBLICATIONS

Brandstein, Michael S., Time-delay Estimation of Reverberated Speech Exploiting Harmonic Structure, May 1999, J. Acoustical Society of America 105(5) pp. 2914-2919.*

* cited by examiner

*Primary Examiner*—Laura A. Grier
(74) *Attorney, Agent, or Firm*—Lyon & Harr, LLP; Richard T. Lyon

(57) ABSTRACT

A system and process for estimating the time delay of arrival (TDOA) between a pair of audio sensors of a microphone array is presented. Generally, a generalized cross-correlation (GCC) technique is employed. However, this technique is improved to include provisions for both reducing the influence (including interference) from correlated ambient noise and reverberation noise in the sensor signals prior to computing the TDOA estimate. Two unique correlated ambient noise reduction procedures are also proposed. One involves the application of Wiener filtering, and the other a combination of Wiener filtering with a $G_{nn}$ subtraction technique. In addition, two unique reverberation noise reduction procedures are proposed. Both involve applying a weighting factor to the signals prior to computing the TDOA which combines the effects of a traditional maximum likelihood (TML) weighting function and a phase transformation (PHAT) weighting function.

9 Claims, 3 Drawing Sheets

SYSTEM AND PROCESS FOR TIME DELAY ESTIMATION IN THE PRESENCE OF CORRELATED NOISE AND REVERBERATION

CROSS-REFERENCE TO RELATED APPLICATIONS:

This application is a continuation of a prior application entitled "A SYSTEM AND PROCESS FOR TIME DELAY ESTIMATION IN THE PRESENCE OF CORRELATED NOISE AND REVERBERATION" which was assigned Ser. No. 10/404,219 and filed Mar. 31, 2003 now U.S. Pat. No. 7,039,200.

BACKGROUND

1. Technical Field

The invention is related to estimating the time delay of arrival (TDOA) between a pair of audio sensors of a microphone array, and more particularly to a system and process for estimating the TDOA using a generalized cross-correlation (GCC) technique that employs provisions making it more robust to correlated ambient noise and reverberation noise.

2. Background Art

Using microphone arrays to locate a sound source has been an active research topic since the early 1990's [2]. It has many important applications including video conferencing [1, 5, 10], video surveillance, and speech recognition [8]. In general, there are three categories of techniques for sound source localization (SSL), i.e. steered-beamformer based, high-resolution spectral estimation based, and time delay of arrival (TDOA) based [2].

The steered-beamformer-based technique steers the array to various locations and searches for a peak in output power. This technique can be tracked back to early 1970s. The two major shortcomings of this technique are that it can easily become stuck in a local maxima and it exhibits a high computational cost. The high-resolution spectral-estimation-based technique representing the second category uses a spatial-spectral correlation matrix derived from the signals received at the microphone array sensors. Specifically, it is designed for far-field plane waves projecting onto a linear array. In addition, it is more suited for narrowband signals, because while it can be extended to wide band signals such as human speech, the amount of computation required increases significantly. The third category involving the aforementioned TDOA-based SSL technique is somewhat different from the first two since the measure in question is not the acoustic data received by the microphone array sensors, but rather the time delays between each sensor. So far, the most studied and widely used technique is the TDOA based approach. Various TDOA algorithms have been developed at Brown University [2], PictureTel Corporation [10], Rutgers University [6], University of Maryland [12], USC [3], UCSD [4], and UIUC [8]. This is by no means a complete list. Instead, it is used to illustrate how much effort researchers have put into this problem.

While researchers are making good progress on various aspects of TDOA, there is still no good solution in real-life environment where two destructive noise sources exist—namely, spatially correlated noise (e.g., computer fans) and room reverberation. With a few exceptions, most of the existing algorithms either assume uncorrelated noise or ignore room reverberation. It has been found that testing on data with uncorrelated noise and no reverberation will almost always give perfect results. But the algorithm will not work well in real-world situations. Thus, there needs to be a more vigorous exploration of the various noise removal techniques to handle the spatially correlated noise issue for real-world situations, along with different weighting functions to deal with the room reverberation issue. This is the focus of the present invention. It is noted, however, that the present invention is directed at providing more accurate "single-frame" estimates. Multiple-frame techniques, e.g., temporal filtering [11], are outside the scope of this invention, but can always be used to further improve the "single-frame" results. On the other hand, better single frame estimates should also improve algorithms based on multiple frames.

It is further noted that in the preceding paragraphs, as well as in the remainder of this specification, the description refers to various individual publications identified by a numeric designator contained within a pair of brackets. For example, such a reference may be identified by reciting, "reference [1]" or simply "[1]". A listing of references including the publications corresponding to each designator can be found at the end of the Detailed Description section.

SUMMARY

The present invention is directed toward a system and process for estimating the time delay of arrival (TDOA) between a pair of audio sensors of a microphone array using a generalized cross-correlation (GCC) technique that employs provisions making it more robust to correlated ambient noise and reverberation noise. (it cannot reduce noises, it can only be more robust to noise)

In the part of the present TDOA estimation system and process involved with reducing the influence of correlated ambient noise, one version applies Wiener filtering to the audio sensor signals. This generally entails multiplying the Fourier transform of the cross correlation of the sensor signals by a first factor representing the percentage of the non-noise portion of the overall signal from the first sensor and a second factor representing the percentage of the non-noise portion of the overall signal from the second sensor. The first factor is computed by initially subtracting the overall noise power spectrum of the signal output by the first sensor, as estimated when there is no speech in the sensor signal, from the energy of the sensor signal output by the first sensor. This difference is then divided by the energy of the first sensor's signal to produce the first factor. The second factor is computed in the same way. Namely, the overall noise power spectrum of the signal output by the second sensor is subtracted from the energy of the sensor signal output by the second sensor, and then the difference is divided by the energy of that signal.

An alternate version of the present correlated ambient noise reduction procedure applies a combined Wiener filtering and $G_{nn}$ subtraction technique to the audio sensor signals. More particularly, the Fourier transform of the cross correlation of the overall noise portion of the sensor signals as estimated when no speech is present in the signals is subtracted from the Fourier transform of the cross correlation of the sensor signals. Then, the difference is multiplied by the aforementioned first and second Wiener filtering factors to further reduce the correlated ambient noise in the signals.

In the part of the present TDOA estimation system and process involved with reducing reverberation noise in the sensor signals, a first version applies a weighting factor that is in essence a combination of a traditional maximum likelihood (TML) weighting function and a phase transformation (PHAT) weighting function. This combined weighting function $W_{MLR}(\omega)$ is defined as $$W_{MLR}(\omega) = \frac{|X_1(\omega)||X_2(\omega)|}{2q|X_1(\omega)|^2|X_2(\omega)|^2 + (1-q)|N_2(\omega)|^2|X_1(\omega)|^2 + |N_1(\omega)|^2|X_2(\omega)|^2}$$

where $X_1(\omega)$ is the fast Fourier transform (FFT) of the signal from a first of the pair of audio sensors, $X_2(\omega)$ is the FFT of the signal from the second of the pair of audio sensors, $|N^1(\omega)|^2$ is the noise power spectrum associated with the signal from the first sensor, $|N_2(\omega)|^2$ is noise power spectrum associated with the signal from the second sensor, and q is a proportion factor.

The proportion factor q ranges between 0 and 1.0, and can be pre-selected to reflect the anticipated proportion of the correlated ambient noise to the reverberation noise. Alternately, proportion factor q can be set to the estimated ratio between the energy of the reverberation and total signal (direct path plus reverberation) at the microphones.

In another version of the process involved with reducing the influence (including interference) from reverberation noise in the sensor signals, a weighting factor is applied that switches between the traditional maximum likelihood (TML) weighting function and the phase transformation (PHAT) weighting function. More particularly, whenever the signal-to-noise ratio (SNR) of the sensor signals exceeds a prescribed SNR threshold, the PHAT weighting function is employed, and whenever the SNR of the signals is less than or equal to the prescribed SNR threshold, the TML weighting function is employed. In tested embodiments of the present system and process, the prescribed SNR threshold was set to about 15 dB.

It is noted that the foregoing procedures are typically performed on a block by block basis where small blocks of audio data are simultaneously sampled from the sensor signals to produce a sequence of consecutive blocks of the signal data from each signal. Each block of signal data is captured over a prescribed period of time and is at least substantially contemporaneous with blocks of the other signal sampled at the same time. The procedures are then performed on each contemporaneous pair of blocks of signal data.

In addition to the just described benefits, other advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

In the following description of the preferred embodiments of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

1.0 The Computing Environment

Figure 1:
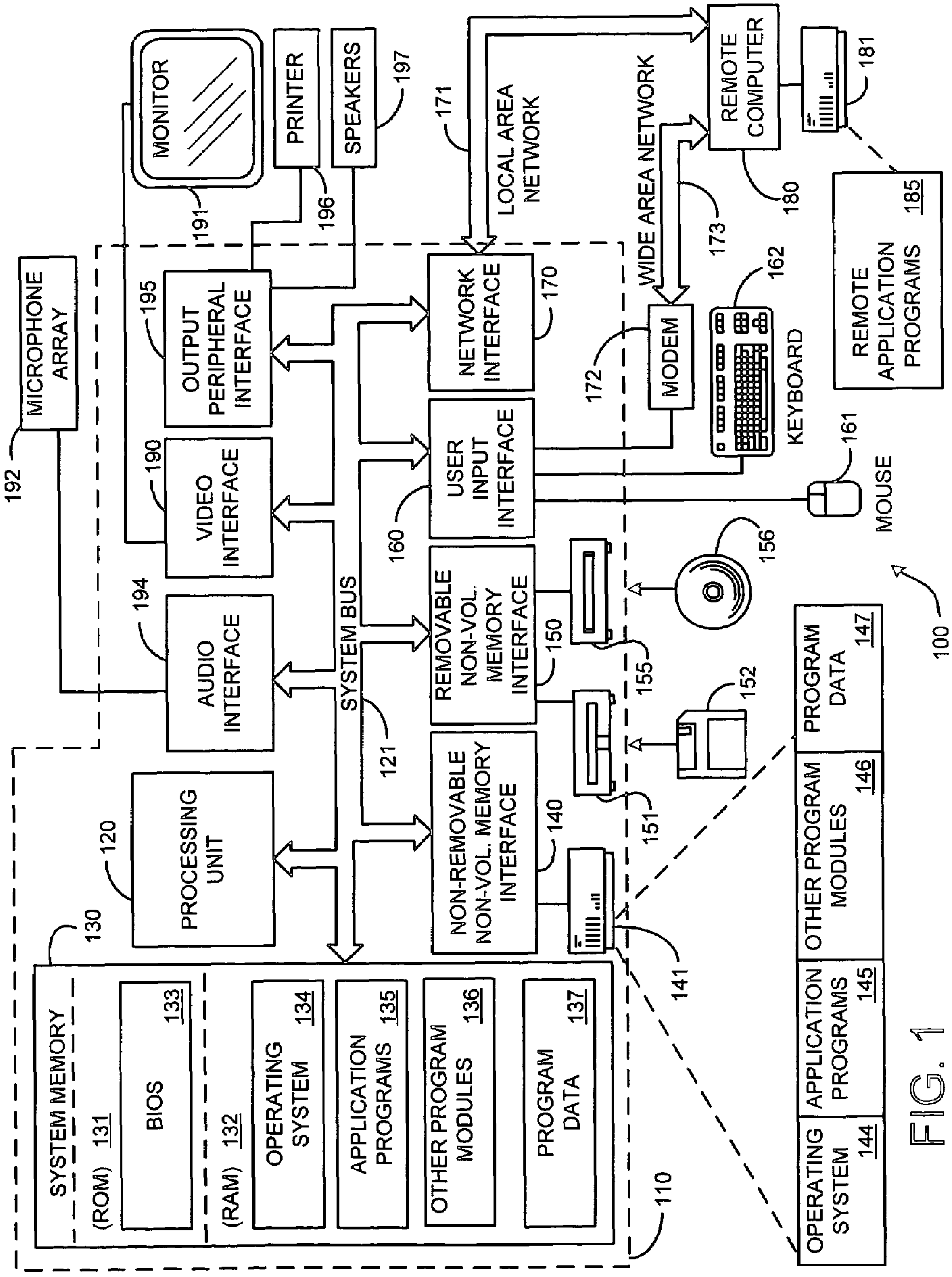
FIG. 1 is a diagram depicting a general purpose computing device constituting an exemplary system for implementing the present invention.

Before providing a description of the preferred embodiments of the present invention, a brief, general description of a suitable computing environment in which the invention may be implemented will be described. FIG. 1 illustrates an example of a suitable computing system environment 100. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 1, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 1 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through an non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195. Of particular significance to the present invention, a microphone array 192, and/or a number of individual microphones (not shown) are included as input devices to the personal computer 110. The signals from the the microphone array 192 (and/or individual microphones if any) are input into the computer 110 via an appropriate audio interface 194. This interface 194 is connected to the system bus 121, thereby allowing the signals to be routed to and stored in the RAM 132, or one of the other data storage devices associated with the computer 110.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

Figure 2:
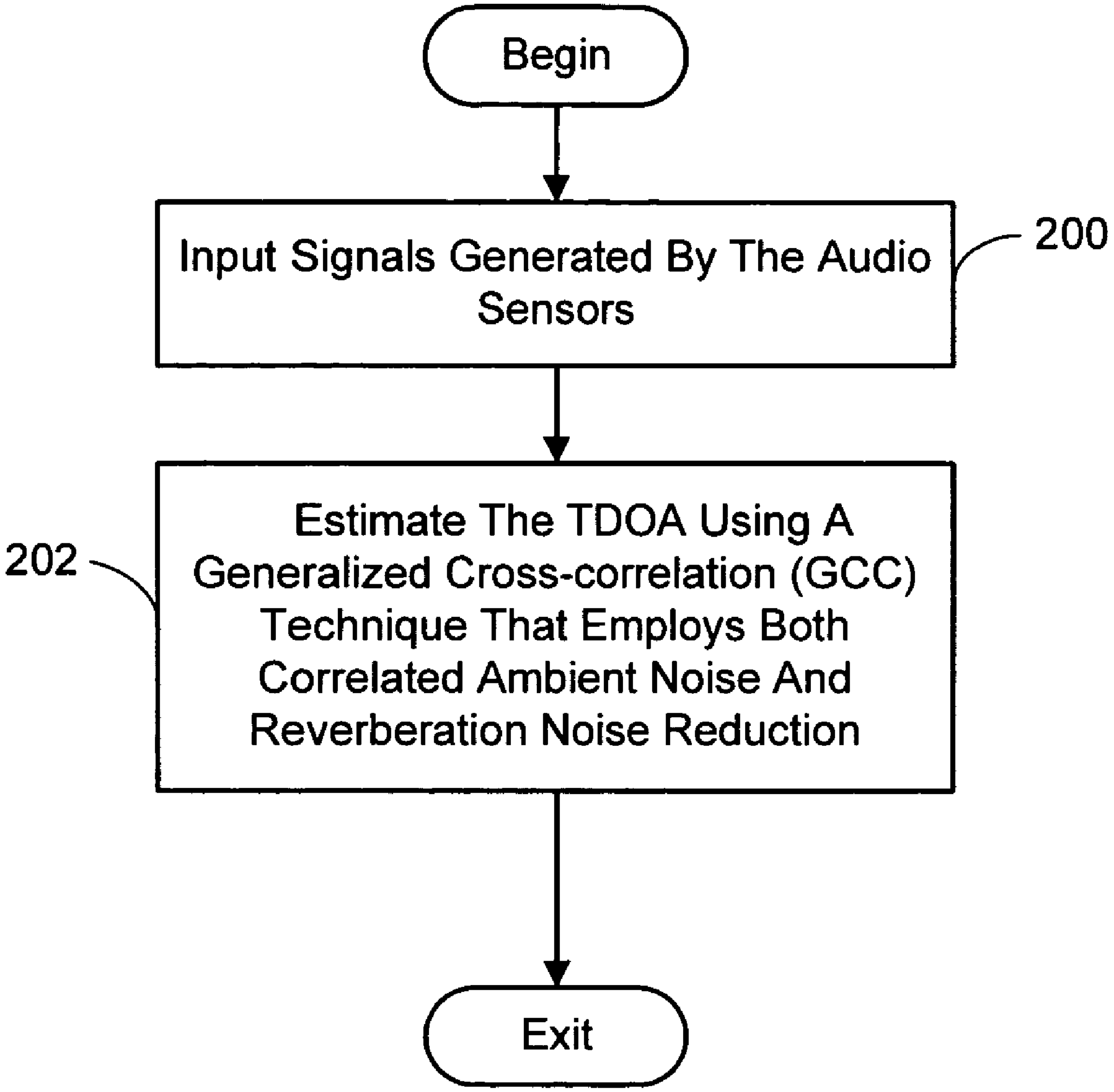
FIG. 2 is a flow chart diagramming an overall process for estimating the TDOA between a pair of audio sensors of a microphone array according to the present invention.

The exemplary operating environment having now been discussed, the remaining part of this description section will be devoted to a description of the program modules embodying the invention. Generally, the system and process according to the present invention involves estimating the time delay of arrival (TDOA) between a pair of audio sensors of a microphone array. In general, this is accomplished via the following process actions, as shown in the high-level flow diagram of FIG. 2:

a) inputting signals generated by the audio sensors (process action 200); and, b) estimating the TDOA using a generalized cross-correlation (GCC) technique that employs both a provision for reducing correlated ambient noise, and a weighting factor for reducing reverberation noise (process action 202).

2.0 TDOA Framework

The general framework for TDOA is to choose the highest peak from the cross correlation curve of two microphones. Let s(n) be the source signal, and $x_1(n)$ and $x_2(n)$ be the signals received by the two microphones, then:

$$x_1(n)=s_1(n)+h_1(n)*s(n)+n_1(n)=a_1s(n-D)+h_1(n)*s(n)+n_1(n)$$

$$x_2(n)=s_2(n)+h_2(n)*s(n)+n_2(n)=a_2s(n)+h_2(n)*s(n)+n_2(n) \qquad (1)$$

where D is the TDOA, $a_1$ and $a_2$ are signal attenuations, $n_1(n)$ and $n_2(n)$ are the additive noise, and $h_1(n)*s(n)$ and $h_2(n)*s(n)$ represent the reverberation. If one can recover the cross correlation between $s_1(n)$ and $s_2(n)$, i.e., $\hat{R}_{s_1s_2}(\tau)$, or equivalently its Fourier transform $\hat{G}_{s_1s_2}(\omega)$, then D can be estimated. In the most simplified case [3, 8], the following assumptions are made:

1. signal and noise are uncorrelated;
2. noises at the two microphones are uncorrelated; and
3. there is no reverberation.

With the above assumptions, $\hat{G}_{s_1s_2}(\omega)$ can be approximated by $\hat{G}_{x_1x_2}(\omega)$, and D can be estimated as follows:

$$D = \arg\max_{\tau} \hat{R}_{s_1s_2}(\tau) \qquad (2)$$

$$\hat{R}_{s_1s_2}(\tau) = \frac{1}{2\pi}\int_{-\pi}^{\pi} \hat{G}_{s_1s_2}(\omega)e^{j\omega\tau}d\omega \approx \frac{1}{2\pi}\int_{-\pi}^{\pi} \hat{G}_{x_1x_2}(\omega)e^{j\omega\tau}d\omega$$

While the first assumption is valid most of the time, the other two are not. Estimating D based on Eq. (2) therefore can easily break down in real-world situations. To deal with this issue, various frequency weighting functions have been proposed, and the resulting framework is called generalized cross correlation, i.e.:

$$D = \arg\max_{\tau} \hat{R}_{s_1s_2}(\tau) \qquad (3)$$

$$\hat{R}_{s_1s_2}(\tau) \approx \frac{1}{2\pi}\int_{-\pi}^{\pi} W(\omega)\hat{G}_{x_1x_2}(\omega)e^{j\omega\tau}d\omega$$

where W(w) is the frequency weighting function.

In practice, choosing the right weighting function is of great significance. Early research on weighting functions can be traced back to the 1970's [6]. As can be seen from Eq. (1), there are two types of noise in the system, i.e., the ambient noise $n_1(n)$ and $n_2(n)$ and reverberation $h_1(n)*s(n)$ and $h_2(n)*s(n)$. Previous research [2, 6] suggests that the traditional maximum likelihood (TML) weighting function is robust to ambient noise and the phase transformation (PHAT) weighting function is better dealing with reverberation:

$$W_{TML}(\omega) = \frac{|X_1(\omega)||X_2(\omega)|}{|N_2(\omega)|^2|X_1(\omega)|^2 + |N_1(\omega)|^2|X_2(\omega)|^2} \qquad (4)$$

$$W_{PHAT}(\omega) = \frac{1}{|\hat{G}_{x_1x_2}(\omega)|} \qquad (5)$$

where $X_i(w)$ and $|N_i(w)|^2$, for i=1,2, are the Fourier transform of the signal and the noise power spectrum, respectively. It is interesting to note that while $W_{TML}(w)$ can be mathematically derived [6], $W_{PHAT}(w)$ is purely heuristics based. Most of the existing work [2, 3, 6, 8, 12] uses either $W_{TML}(w)$ or $W_{PHAT}(w)$.

3.0 A Two-Stage Perspective

In this section, the TDOA estimation problem will be analyzed as a two-stage process—namely first removing the correlated noise and then attempting to minimize the reverberation effect.

3.1 Correlated Noise Removal

In offices and conference rooms, there are many noise sources, e.g., ceiling fans, computer fans and computer hard drives. These noises will be heard by both microphones. It is therefore unrealistic to assume $n_1(n)$ and $n_2(n)$ are uncorrelated. They are, however, stationary or short-time stationary, such that it is possible to estimate the noise spectrum over time. Three techniques will now be described for removing correlated noise. While the first one is known [10], the other two are novel to the present invention.

3.1.1 $G_{nn}$ Subtraction (GS)

If $n_1(n)$ and $n_2(n)$ are correlated, then $\hat{G}_{x_1x_2}(\omega)=\hat{G}_{s_1s_2}(\omega)+\hat{G}_{n_1n_1}(\omega)$. Therefore, a better estimate of $\hat{G}_{s_1s_2}(\omega)$ can be obtained as:

$$\hat{G}_{s_1s_2}{}^{GS}(\omega)=\hat{G}_{x_1x_2}(\omega)-\hat{G}_{n_1n_2}(\omega) \quad (6)$$

where $\hat{G}_{n_1n_2}(\omega)$ is estimated when there is no speech.

3.1.2 Wiener Filtering (WF)

Wiener filtering reduces stationary noise. If each microphone's signal is passed through a Wiener filter, it would be expected to see a lesser amount of correlated noise in $\hat{G}_{x_1x_2}(\omega)$. Thus, $$\hat{G}_{s_1s_2}{}^{WF}(\omega)=W_1(\omega)W_2(\omega)\hat{G}_{x_1x_2}(\omega)$$

$$W_i(\omega)=(|X_i(\omega)|^2-|N_i(\omega)|^2)/|X_i(\omega)|^2 i=1,2 \quad (7)$$

where $|N_i(w)|^2$ is estimated when there is no speech.

3.1.3. Wiener Filtering and $G_{nn}$ Subtraction (WG)

Wiener filtering will not completely remove the stationary noise. However, the residual can further be removed by using GS. Thus, combining Wiener filtering with $G_{nn}$ subtraction can produce even better noise reduction results. This combined correlated noise removal technique (referred to as WG herein) is defined by:

$$\hat{G}_{s_1s_2}{}^{WG}(\omega)=W_1(\omega)W_2(\omega)(\hat{G}_{x_1x_2}(\omega)-\hat{G}_{n_1n_2}(\omega)) \quad (8)$$

3.2 Alleviating Reverberation Effects

While there are existing techniques to remove correlated noise as discussed above, no effective technique is available to remove reverberation. But it is possible to alleviate the reverberation effect to a certain extent using a maximum likelihood weighting function.

Even though reverberation is thought of as correlated noise in that it effects the signal produced by both microphones, a closer examination reveals that it is not correlated in the frequency domain. When reverberation noise is viewed in the frequency domain over a frame of audio input it is discovered that it acts independently of frequency. In other words, contrary to what may have been intuitive and the common belief in the field of noise reduction, between each frequency the delay in the reverberation signal reaching each microphone varies and the sum of these delays tends toward zero. Thus, in practical terms reverberation noise is not correlated to the source. Given this realization, it becomes clear that reverberation noise can be filtered out of the microphone signal. One embodiment of a process for filtering out reverberation will now be described.

If reverberation is considered as just another type of noise, then $$|N_i^T(\omega)|^2=|H_i(\omega)|^2|S(\omega)|^2+|N_i(\omega)|^2 \quad (9)$$

where $|N_i^T(w)|^2$ represents the total noise. Further, if it is assumed that the phase of $H_i(\omega)$ is random and independent of $S(\omega)$ as indicated above, then $E\{S(\omega)H_i(\omega)S^*(\omega)\}=0$, and, from Eq. (1), the following energy equation formed, $$|X_i(\omega)|^2=a|S(\omega)|^2+|H_i(\omega)|^2|S(\omega)|^2+|N_i(\omega)|^2 \quad (10)$$

Both the reverberant signal and the direct-path signal are caused by the same source. The reverberant energy is therefore proportional to the direct-path energy, by a constant. Thus, $$|X_i(\omega)|^2=a|S(\omega)|^2+p|S(\omega)|^2+|N_i(\omega)|^2 \Rightarrow p|S(\omega)|^2=p/(a+p)\times(|X_i(\omega)|^2-|N_i(\omega)|^2) \quad (11)$$

The total noise is therefore:

$$\begin{aligned}|N_i^T(\omega)|^2 &= p/(a+p)\times(|X_i(\omega)|^2-|N_i(\omega)|^2)+|N_i(\omega)|^2 \\ &= q|X_i(\omega)|^2+(1-q)|N_i(\omega)|^2\end{aligned} \quad (12)$$

where q=p/(a+p). If Eq. (12) is substituted into Eq. (4), the ML weighting function for the reverberant situation is created. Namely, $$W_{MLR}(\omega)=\frac{|X_1(\omega)||X_2(\omega)|}{2q|X_1(\omega)|^2|X_2(\omega)|^2+(1-q)|N_2(\omega)|^2|X_1(\omega)|^2+|N_1(\omega)|^2|X_2(\omega)|^2} \quad (13)$$

It is noted that the selection of a value for q in Eq. 13 allows the tailoring of the weight given to the reverberation noise reduction component versus the ambient (correlated) noise reduction component. Thus, with prior knowledge of the approximate mix of reverberation and ambient noise anticipated, q can be set appropriately. Alternatively, if such prior knowledge is not available, p can be computed to determine the appropriate value for q. However, in practice a precise estimation or computation of q may be hard to obtain.

In view of this it is noted that when the ambient noise dominates, $W_{MLR}(w)$ reduces to the traditional ML solution without reverberation $W_{TML}(w)$ (see Eq. (4)). In addition, when the reverberation noise dominates, $W_{MLR}(w)$ reduces to $W_{PHAT}(w)$ (see Eq. (5)). This agrees with the previous research that PHAT is robust to reverberation when there is no ambient noise 0. These observation suggest it is also possible to design another weighting function heuristically, which performs almost as well as the optimum solution provided by $W_{MLR}(w)$. Specifically, when the signal to noise ratio (SNR) is high, $W_{PHAT}(w)$ is chosen and when SNR is low $W_{TML}(w)$ is chosen. This weighting function will be referred to as $W_{SWITCH}(w)$:

$$W_{SWITCH}(\omega)=\begin{cases}W_{PHAT}(\omega), & SNR>SNR_0\\ W_{TML}(\omega), & SNR\le SNR_0\end{cases} \quad (14)$$

where $SNR_0$ is a predetermined threshold, e.g., about 15 dB. This alternate weighting function is advantageous because SNR is relatively easy to estimate.

4.0 Experimental Results

We have done experiments on all the major combinations listed in Table 1. Furthermore, for the test data, we covered a wide range of sound source angles from −80 to +80 degrees. Here we report only three sets of experiments designed to compare different techniques on the following aspects:

1. For a uniform weighting function, which noise removal techniques is the best?
2. If we turn off the noise removal technique, which weighting function performs the best?
3. Overall, which algorithm (e.g., a particular cell in Table 1) is the best?

4.1 Test Data Description

We take into account both correlated noise and reverberation when generating our test data. We generated a plenitude of data using the imaging method of [9]. The setup corresponds to a 6 m×7 m×2.5 m room, with two microphones placed 15 cm apart, 1 m from the floor and 1 m from a 6 m wall (in relation to which they are centered). The absorption coefficient of the wall was computed to produce several reverberation times, but results are presented here only for $T_{60}$=50 ms. Furthermore, two noise sources were included: fan noise in the center of room ceiling, and computer noise in the left corner opposite to the microphones, at 50 cm from the floor. The same room reverberation model was used to add reverberation to these noise signals, which were then added to the already reverberated desired signal. For more realistic results, fan noise and computer noise were actually acquired from a ceiling fan and from a computer. The desired signal is 60-second of normal speech, captured with a close talking microphone.

The sound source is generated for 4 different angles: 10, 30, 50, and 70 degrees, viewed from the center of the two microphones. The 4 sources are all 3 m away from the microphone center. The SNRs are 0 dB when both ambient noise and reverberation noise are considered. The sampling frequency is 44.1 KHz, and frame size is 1024 samples (~23 ms). We band pass the raw signal to 800 Hz–4000 Hz. Each of the 4 angle testing data is 60-second long. Out of the 60-second data, i.e., 2584 frames, about 500 frames are speech frames. The results reported in this section are obtained by using all the 500 frames.

Figure 3:
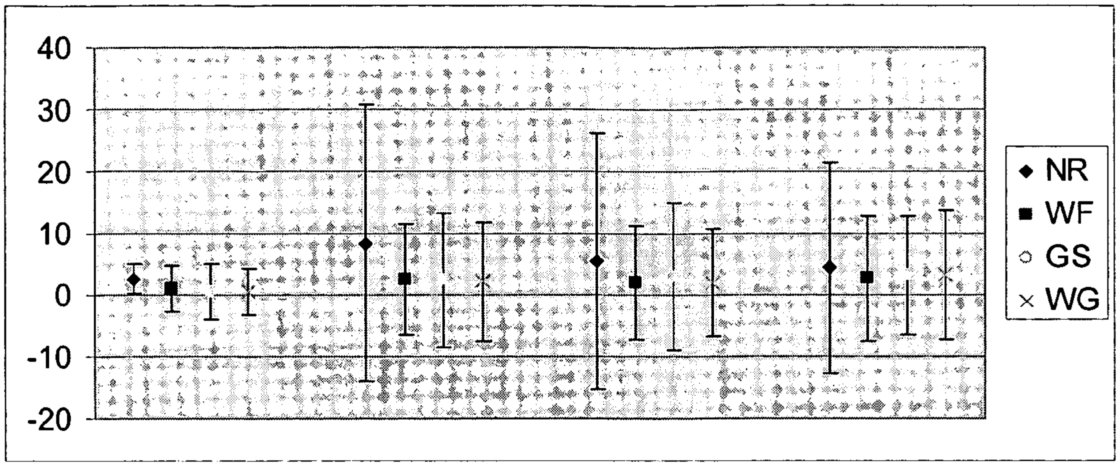
FIG. 3 depicts a graph plotting the variation in the estimated angle associated with the direction of a sound source as derived using a TDOA computed with various correlated noise removal methods including No Removal (NR), $G_{nn}$ Subtraction (GS), Wiener Filtering (WF), and both WF and GS (WG), which are represented by the vertical bars grouped in four actual angle categories (i.e., 10, 30, 50 and 70 degrees), where the vertical axis shows the error in degrees. The center of each bar represents the average estimated angle over the 500 frames and the height of each bar represents 2× the standard deviation of the 500 estimates.
Figure 4:
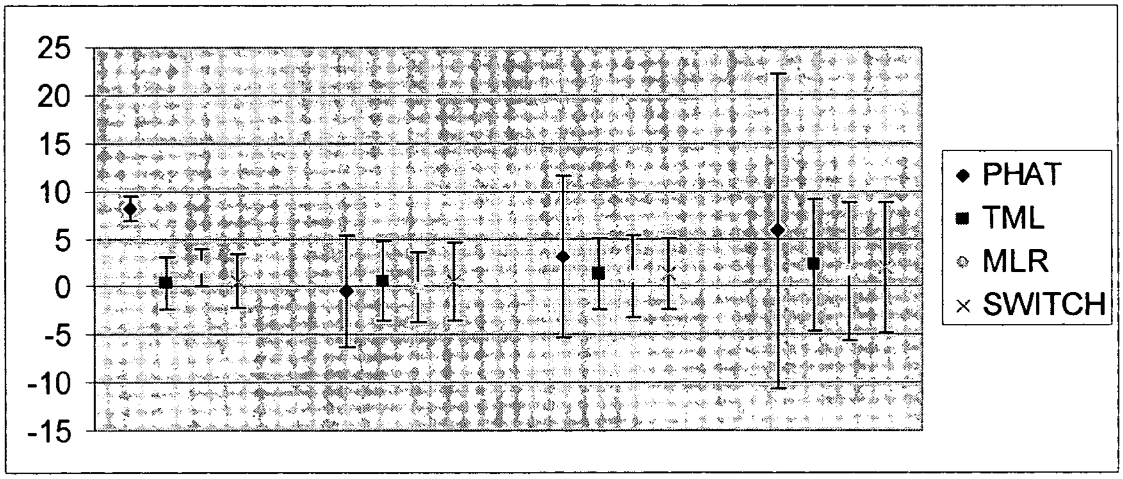
FIG. 4 depicts a graph plotting the variation in the estimated angle associated with the direction of a sound source as derived using a TDOA computed with various reverberation noise removal methods including $W_{PHAT}$(w), $W_{TML}$(w), $W_{MLR}$(w) with (q=0.3), and $W_{SWITCH}$(w), which are represented by the vertical bars grouped in four actual angle categories (i.e., 10, 30, 50 and 70 degrees), where the vertical axis shows the error in degrees. The center of each bar represents the average estimated angle over the 500 frames and the height of each bar represents 2× the standard deviation of the 500 estimates.
Figure 5:
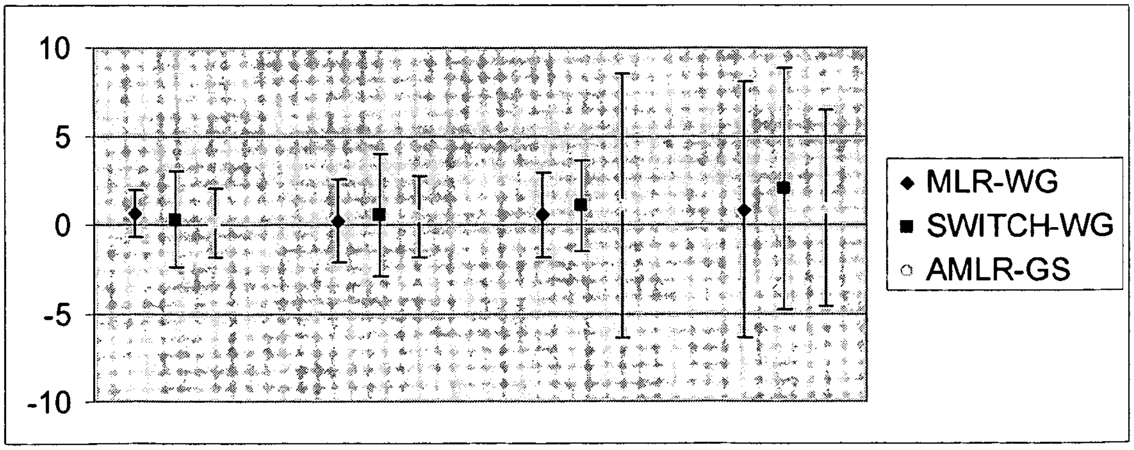
FIG. 5 depicts a graph plotting the variation in the estimated angle associated with the direction of a sound source as derived using a TDOA computed via various combined correlated and reverberation noise removal methods including $W_{MLR}$(w)-WG and $W_{SWITCH}$(w)-WG and $W_{AMLR}$(w)-GS, which are represented by the vertical bars grouped in four actual angle categories (i.e., 10, 30, 50 and 70 degrees), where the vertical axis shows the error in degrees. The center of each bar represents the average estimated angle over the 500 frames and the height of each bar represents 2× the standard deviation of the 500 estimates.

There are 4 groups in each of the FIGS. 3–5, corresponding to ground truth angles at 10, 30, 50 and 70 degrees. Within each group, there are several vertical bars representing different techniques to be compared. The vertical axis in figures is error in degrees. The center of each bar represents the average estimated angle over the 500 frames. Close to zero means small estimation bias. The height of each bar represents 2× the standard deviation of the 500 estimates. Short bars indicate low variance. Note also that the fact that results are better for smaller angles is expected and intrinsic to the geometry of the problem.

4.2 Experiment 1: Correlated Noise Removal

Here, we fix the weighting function as $W_{BASE}$(w) and compare the following four noise removal techniques: No Removal (NR), $G_{nn}$ Subtraction (GS), Wiener Filtering (WF), and both WF and GS (WG). The results are summarized in FIG. 3, and the following observations can be made:

1. All three of the correlated noise removal techniques are better than NR. They have smaller bias and smaller variance.
2. WG is slightly better than the other two techniques. This is especially true when the source angle is small.

4.3 Experiment 2: Alleviating Reverberation Effects

Here, we turn off the noise removal condition (i.e., NR in Table 1), and then compare the following 4 weighting functions: $W_{PHAT}$(w), $W_{TML}$(w), $W_{MLR}$(w) with (q=0.3), and $W_{SWITCH}$(w). The results are summarized in FIG. 4, and the following observations can be made:

1. Because the test data contains both correlated ambient noise and reverberation noise, the condition for $W_{PHAT}$(w) is not satisfied. It therefore gives poor results, e.g., high bias at 10 degrees and high variance at 70 degrees.
2. Similarly, the condition for $W_{TML}$(w) is not satisfied either, and it has high bias especially when the source angle is large.
3. Both $W_{MLR}$(w) and $W_{SWITCH}$(w) perform well, as they simultaneously model ambient noise and reverberation.

4.4 Experiment 3: Overall Performance

Here, we are interested in the overall performance. We report on only the two techniques according to the present invention (i.e., $W_{MLR}$(w)-WG and $W_{SWITCH}$(w)-WG) and compare them against the approach of [10], one of the best currently available. The technique of [10] is $W_{AMLR}$(w)-GS in our terminology (see Table 1). The results are summarized in FIG. 5. The following observations can be made:

1. All the three algorithms perform well in general—all have small bias and small variance.
2. $W_{MLR}$(w)-WG seems to be the overall winning algorithm. It is more consistent than the other two. For example, $W_{SWITCH}$(w)-WG has big bias at 70 degrees and $W_{AMLR}$(w)-GS has big variance at 50 degrees.

5.0 References

[1] S. Birchfield and D. Gillmor, Acoustic source direction by hemisphere sampling, *Proc. of ICASSP,* 2001.

[2] M. Brandstein and H. Silverman, A practical methodology for speech localization with microphone arrays, Technical Report, Brown University, Nov. 13, 1996

[3] P. Georgiou, C. Kyriakakis and P. Tsakalides, Robust time delay estimation for sound source localization in noisy environments, *Proc. of WASPAA,* 1997

[4] T. Gustafsson, B. Rao and M. Trivedi, Source localization in reverberant environments: performance bounds and ML estimation, *Proc. of ICASSP,* 2001.

[5] Y. Huang, J. Benesty, and G. Elko, Passive acoustic source location for video camera steering, *Proc. of ICASSP,* 2000.

[6] J. Kleban, Combined acoustic and visual processing for video conferencing systems, MS Thesis, The State University of New Jersey, Rutgers, 2000

[7] C. Knapp and G. Carter, The generalized correlation method for estimation of time delay, *IEEE Trans. on ASSP*, Vol. 24, No. 4, August, 1976

[8] D. Li and S. Levinson, Adaptive sound source localization by two microphones, *Proc. of Int. Conf. on Robotics and Automation*, Washington D.C., May 2002

[9] P. M. Peterson, Simulating the response of multiple microphones to a single acoustic source in a reverberant room, *J. Acoust. Soc. Amer.*, vol. 80, pp1527–1529, November 1986.

[10] H. Wang and P. Chu, Voice source localization for automatic camera pointing system in videoconferencing, *Proc. of ICASSP,* 1997

[11] D. Ward and R. Williamson, Particle filter beamforming for acoustic source localization in a reverberant environment, *Proc. of ICASSP,* 2002.

[12] D. Zotkin, R. Duraiswami, L. Davis, and I. Haritaoglu, An audio-video front-end for multimedia applications, *Proc. SMC*, Nashville, Tenn., 2000.

What is claimed is:

1. A computer-implemented process for estimating the time delay of arrival (TDOA) between a pair of audio sensors of a microphone array, comprising using a computer to perform the following process actions:

inputting signals generated by the audio sensors; and estimating the TDOA using a generalized cross-correlation (GCC) technique which, employs a provision for reducing the influence from correlated ambient noise, and employs a weighting factor for reducing the influence from reverberation noise and residual correlated ambient noise by establishing a combined weighting function which applies a proportioned combination of a traditional maximum likelihood (TML) weighting function and a phase transformation (PHAT) weighting function.

2. The process of claim 1, wherein the process action of employing a provision in the GCC technique for reducing the influence from correlated ambient noise, comprises an action of applying Wiener filtering to the audio sensor signals.

3. The process of claim 1, wherein the proportion of the combined weighting function attributable to the traditional maximum likelihood (TML) weighting function to the proportion of the combined weighting function attributable to the phase transformation (PHAT) weighting function that is applied is based on an estimate of the proportion of the overall noise attributable to residual correlated ambient noise to the proportion of the overall noise attributable to reverberation noise.

4. A computer-readable medium having computer-executable instructions for estimating the time delay of arrival (TDOA) between a pair of audio sensors of a microphone array, said computer-executable instructions comprising:

inputting signals generated by each audio sensor of the microphone array;

simultaneously sampling the inputted signals to produce a sequence of consecutive blocks of the signal data from each signal, wherein each block of signal data is captured over a prescribed period of time and is at least substantially contemporaneous with blocks of the other signal sampled at the same time;

for each contemporaneous pair of blocks of signal data, estimating the TDOA using a generalized cross-correlation (GCC) technique which, employs a provision for reducing the influence from correlated ambient noise, and employs a weighting factor for reducing the influence from reverberation noise and residual correlated ambient noise by establishing a combined weighting function which applies a proportioned combination of a traditional maximum likelihood (TML) weighting function and a phase transformation (PHAT) weighting function.

5. The computer-readable medium of claim 4, wherein the proportion of the combined weighting function attributable to the traditional maximum likelihood (TML) weighting function to the proportion of the combined weighting function attributable to the phase transformation (PHAT) weighting function that is applied is based on an estimate of the proportion of the overall noise attributable to residual correlated ambient noise to the proportion of the overall noise attributable to reverberation noise.

6. A computer-implemented process for estimating the time delay of arrival (TDOA) between a pair of audio sensors of a microphone array, comprising using a computer to perform the following process actions:

inputting signals generated by the audio sensors; and estimating the TDOA using a generalized cross-correlation (GCC) technique which, employs a provision for reducing the influence from correlated ambient noise by applying Wiener filtering to the audio sensor signals, said Wiener filtering comprising multiplying the Fourier transform of the cross correlation of the sensor signals by a factor representing the percentage of the non-noise portion of the overall signal from the first sensor and a factor representing the percentage of the non-noise portion of the overall signal from the second sensor; and employs a weighting factor for reducing the influence from reverberation noise and residual correlated ambient noise by establishing a combined weighting function which applies a proportioned combination of a traditional maximum likelihood (TML) weighting function and a phase transformation (PHAT) weighting function.

7. The process of claim 6, wherein the proportion of the combined weighting function attributable to the traditional maximum likelihood (TML) weighting function to the proportion of the combined weighting function attributable to the phase transformation (PHAT) weighting function that is applied is based on an estimate of the proportion of the overall noise attributable to residual correlated ambient noise to the proportion of the overall noise attributable to reverberation noise.

8. A computer-implemented process for estimating the time delay of arrival (TDOA) between a pair of audio sensors of a microphone array, comprising using a computer to perform the following process actions:

inputting signals generated by the audio sensors; and estimating the TDOA using a generalized cross-correlation (GCC) technique which, employs a provision for reducing the influence from correlated ambient noise comprising the application of a combined Wiener filtering and $G_{nn}$ subtraction technique to the audio sensor signals, and employs a weighting factor for reducing the influence from reverberation noise and residual correlated ambient noise by establishing a combined weighting function which applies a proportioned combination of a traditional maximum likelihood (TML) weighting function and a phase transformation (PHAT) weighting function.

9. The process of claim 8, wherein the proportion of the combined weighting function attributable to the traditional maximum likelihood (TML) weighting function to the proportion of the combined weighting function attributable to the phase transformation (PHAT) weighting function that is applied is based on an estimate of the proportion of the overall noise attributable to residual correlated ambient noise to the proportion of the overall noise attributable to reverberation noise.

* * * * *